United States Patent
Stahrenberg et al.

(10) Patent No.: US 9,142,547 B2
(45) Date of Patent: Sep. 22, 2015

(54) METHODS OF MANUFACTURING RESISTORS AND STRUCTURES THEREOF

(75) Inventors: Knut Stahrenberg, Wappingers Falls, NY (US); Jin-Ping Han, Fishkill, NY (US)

(73) Assignee: Infineon Technologies AG, Neubiberg (DE)

( * ) Notice: Subject to any disclaimer, the term of this patent is extended or adjusted under 35 U.S.C. 154(b) by 459 days.

(21) Appl. No.: 13/077,554

(22) Filed: Mar. 31, 2011

(65) Prior Publication Data

US 2011/0175174 A1 Jul. 21, 2011

Related U.S. Application Data

(62) Division of application No. 12/478,905, filed on Jun. 5, 2009, now Pat. No. 7,951,664.

(51) Int. Cl.
 *H01L 27/06* (2006.01)
 *H01L 49/02* (2006.01)
 *H01L 21/8238* (2006.01)

(52) U.S. Cl.
 CPC ............ *H01L 27/0629* (2013.01); *H01L 28/20* (2013.01); *H01L 21/823814* (2013.01)

(58) Field of Classification Search
 CPC . H01L 27/0629; H01L 28/20; H01L 27/0635; H01L 27/0727; H01L 27/0738
 USPC ......... 257/358–360, 363, 379, 380, 536, 537; 438/300
 See application file for complete search history.

(56) References Cited

U.S. PATENT DOCUMENTS

| | | | | |
|---|---|---|---|---|
| 5,489,796 | A * | 2/1996 | Harward | 257/379 |
| 6,548,840 | B1 * | 4/2003 | Pobanz et al. | 257/252 |
| 6,869,839 | B2 | 3/2005 | Lee et al. | |
| 6,958,523 | B2 * | 10/2005 | Babcock et al. | 257/538 |
| 7,183,593 | B2 * | 2/2007 | Yeo et al. | 257/195 |
| 7,465,634 | B2 * | 12/2008 | Lim et al. | 438/300 |
| 7,491,615 | B2 | 2/2009 | Wu et al. | |
| 7,494,884 | B2 | 2/2009 | Lin et al. | |
| 7,504,297 | B2 | 3/2009 | Watanabe et al. | |
| 7,803,687 | B2 | 9/2010 | Chiu et al. | |
| 7,879,666 | B2 * | 2/2011 | Zhang et al. | 438/197 |
| 2006/0166457 | A1 * | 7/2006 | Liu et al. | 438/400 |
| 2006/0186484 | A1 * | 8/2006 | Chau et al. | 257/401 |
| 2006/0246654 | A1 | 11/2006 | Shin | |
| 2007/0187776 | A1 * | 8/2007 | Sasaki | 257/379 |
| 2009/0283840 | A1 | 11/2009 | Coolbaugh et al. | |
| 2010/0112764 | A1 | 5/2010 | Mehrotra et al. | |
| 2010/0289080 | A1 | 11/2010 | Wei et al. | |
| 2012/0223309 | A1 | 9/2012 | Mowry et al. | |

FOREIGN PATENT DOCUMENTS

DE 10 2007 063 229 A1 7/2009
DE 10 2009 021 485 A1 11/2010

* cited by examiner

*Primary Examiner* — Bryan Junge
(74) *Attorney, Agent, or Firm* — Slater & Matsil, L.L.P.

(57) ABSTRACT

A semiconductor device includes a semiconductor body of a first semiconductive material. A transistor is disposed in the semiconductor body. The transistor includes source and drain regions of a second semiconductive material embedded in the semiconductor body. A resistor overlies a top surface of the semiconductor body and is laterally spaced from the transistor. The resistor is formed from the second semiconductive material.

24 Claims, 4 Drawing Sheets

METHODS OF MANUFACTURING RESISTORS AND STRUCTURES THEREOF

This is a divisional of application Ser. No. 12/478,905, filed Jun. 5, 2009 and now U.S. Pat. No. 7,951,664 which application is incorporated herein by reference.

THE NAMES OF THE PARTIES TO A JOINT RESEARCH AGREEMENT

The invention was made under a joint research agreement between Infineon Technologies and International Business Machines Corporation.

TECHNICAL FIELD

The present invention relates generally to the fabrication of semiconductor devices, and more particularly to the fabrication of resistors in integrated circuits.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various layers using lithography to form circuit components and elements thereon.

Resistors are elements that are used in semiconductor devices in many applications. A resistor is a two-terminal electronic component designed to oppose an electric current by producing a voltage drop between the two terminals of the resistor in proportion to the current. The resistance (R) of a resistor is equal to the voltage drop (V) across the resistor divided by the current (I) through the resistor, in accordance with Ohm's law (V=IR, or R=V/I). Resistors are used as part of electronic circuits and may be formed in integrated circuits and semiconductor devices. Resistors are used in applications such as electronic filters, analog-to-digital converters, memory devices, control applications, and many other types of semiconductor device applications. Rather large resistors with high resistance values are often required in radio frequency (RF), analog, and mixed signal devices, as examples.

Transistors are elements that are also used frequently in semiconductor device applications. In the past, gate dielectric materials of transistors in semiconductor devices typically comprised silicon dioxide, which has a dielectric constant or k value of about 3.9. Gate materials of transistors in the past typically comprised polysilicon. However, in some smaller and more advanced semiconductor technologies, such as in a 32 nm technology node, as an example, the use of gate dielectric materials comprising silicon oxynitride and other high k dielectric materials such as hafnium-based dielectric materials having a dielectric constant (k) of greater than about 3.9 have begun to be a trend. Gate materials that include metal layers have also begun to be used for transistors in semiconductor devices.

In some transistor applications, it is desirable to manufacture resistors from the same material layers that transistor gates elsewhere on the chip are manufactured from. However, for some transistors that have a high k gate dielectric material and that include a metal layer in the gate stack, for example, the resistance of resistors manufactured from the same gate stack as the transistors is too low for some applications, due to the presence of the metal layer, particularly in RF applications. For example, in some RF designs, high-precision high and medium ohmic resistors are required. In some technology nodes, such as 32 nm as an example, a P+ doped polysilicon resistor may have a resistance that is dominated by the low resistance of the underlying metal layer, resulting in a sheet resistance of about 150 Ohms/square, which is too low for the requirements of some RF designs.

Removing the metal layer in the resistor region results in a higher resistance value for a resistor, but requires an additional masking level and lithography process, which adds to the complexity and expense of the fabrication process.

Thus, what are needed in the art are improved methods of fabricating resistors in semiconductor devices and structures thereof.

SUMMARY OF THE INVENTION

Technical advantages are generally achieved by preferred embodiments of the present invention, which provide novel methods of manufacturing resistors and semiconductor devices, and structures thereof.

In accordance with one embodiment, a method of fabricating a resistor includes forming a transistor material stack over a workpiece and patterning the transistor material stack, forming a gate of a transistor in a first region of the workpiece and leaving a portion of the transistor material stack in a second region of the workpiece. A top portion of the transistor material stack is removed in the second region, and a top portion of the workpiece is removed in the first region proximate the gate of the transistor, forming recessed regions in the workpiece in the first region. A semiconductive material is formed in the recessed regions of the workpiece in the first region and over a portion of the transistor material stack in the second region, forming a resistor in the second region.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments of the present invention achieve technical advantages by providing novel methods of fabricating resistors that do not require any additional manufacturing steps and may be implemented by modifying existing lithography mask sets in some embodiments. The methods are cost-effective and result in resistors having large resistance values. The resistors comprise the same semiconductive material that is formed in source and drain regions of transistors elsewhere on a semiconductor device, to be described further herein. The metal layer of the transistor material stack in the resistor region is removable using a pre-cleaning step for another process, so that an additional lithography process is not required to remove the metal layer in the resistor region.

Figure 1:
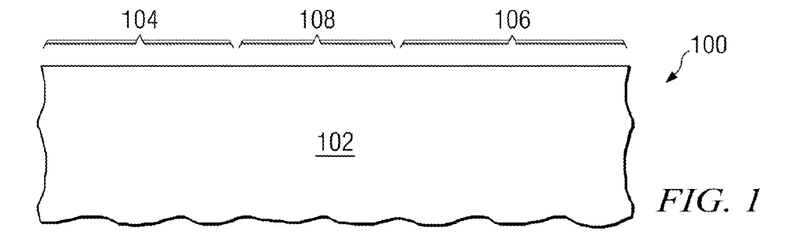
FIGS. 1 through 11 show cross-sectional views of a method of manufacturing a semiconductor device at various stages in accordance with an embodiment of the present invention.

FIGS. 1 through 11 show cross-sectional views of a method of manufacturing a semiconductor device 100 that includes a resistor 136 (see FIG. 11) at various stages in accordance with an embodiment of the present invention. Referring to FIG. 1, to manufacture the semiconductor device 100, first, a workpiece 102 is provided. The workpiece 102 may comprise a semiconductor substrate comprising silicon, body, or wafer, for example. The workpiece 102 may include other active components or circuits formed within and/or over the workpiece 102, not shown. The workpiece 102 may comprise silicon oxide over single-crystal silicon, for example. The workpiece 102 may include other conductive layers or other semiconductor elements, e.g., transistors, diodes, etc., not shown. Compound semiconductors, GaAs, InP, Si/Ge, or SiC, as examples, may be used in place of silicon. The workpiece 102 may comprise a silicon-on-insulator (SOI) or a SiGe-on-insulator substrate, as examples.

The workpiece 102 comprises a first region 104 where at least one first transistor 134 (not shown in FIG. 1; see FIG. 11) will be formed and a second region 106 where at least one resistor 136 will be formed. The workpiece 102 may optionally also include a third region 108 in which at least one second transistor 138 (see FIG. 11) will be formed. The first transistor 134 may comprise a positive channel metal oxide semiconductor (PMOS) transistor, and the second transistor 138 may comprise a negative channel metal oxide semiconductor (NMOS) transistor of a complementary metal oxide semiconductor (CMOS) device, for example.

Figure 11:
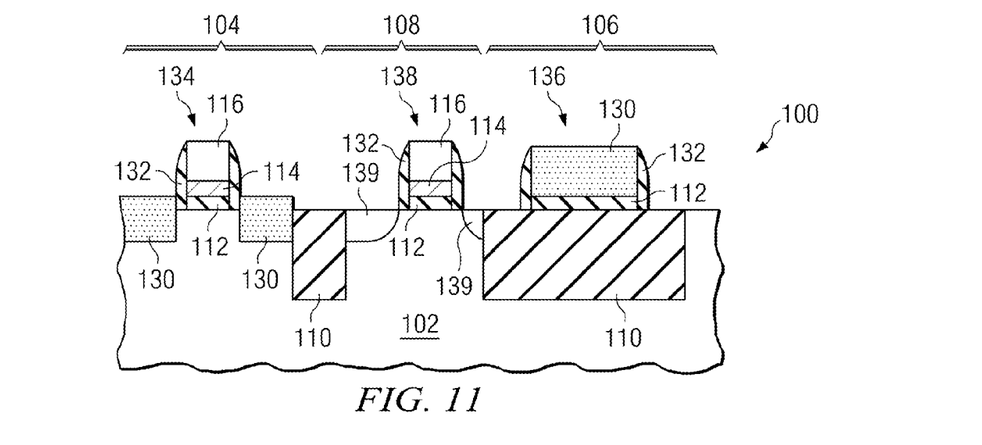

In FIG. 11, only one transistor 134 is shown in the first region 104 and only one resistor 136 is shown in the second region 106. Alternatively, a plurality of transistors 134 may be formed in the first region 104, and a plurality of resistors 136 may be formed in the second region 106. Likewise, a plurality of second transistors 138 may be formed in the optional third region 108. Only one first region 104, second region 106, and third region 108 are shown in the drawings; however, a plurality of first regions 104, second regions 106, and third regions 108 may be formed across a surface of the workpiece 102, for example.

Figure 2:
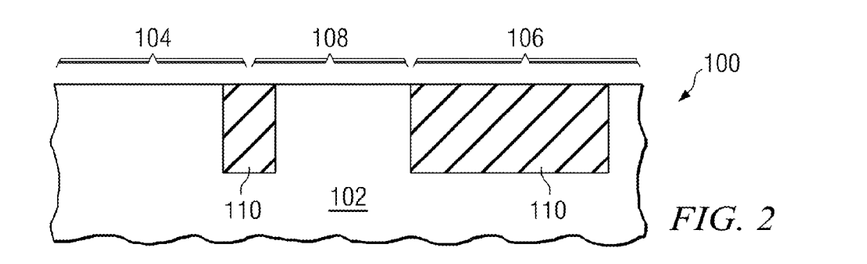

Isolation regions 110 are formed in the workpiece 102, as shown in FIG. 2. The isolation regions 110 may comprise shallow trench isolation (STI) regions or other types of isolation regions such as deep trench (DT) isolation and/or field oxide (FOX) regions, for example. The isolation regions 110 may be formed by etching trenches in the workpiece 102 using lithography and filling the trenches with one or more insulating materials, for example. One or more isolation regions, or portions of isolation regions 110, may be formed in the first region 104, second region 106, and third region 108, for example. One or more isolation regions 110 may be formed between the first region 104 and the third region 108, as shown. An isolation region 110 may be formed in the second region 106 to isolate the resistor 136 from the workpiece 102. For example, the resistor 136 may be formed over the isolation region 110 in the second region 106.

Figure 3:
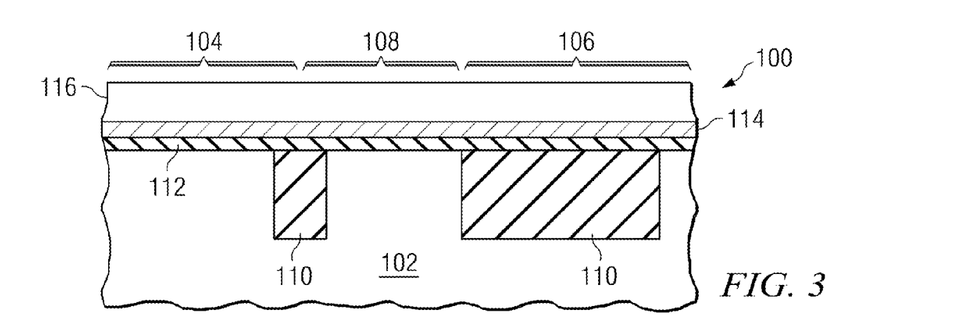

A transistor material stack 112/114/116 is formed over the workpiece 102 and over the isolation regions 110, as shown in FIG. 3. To form the transistor material stack 112/114/116, a gate dielectric material 112 comprising an insulating material is formed over the workpiece 102. The gate dielectric material 112 may comprise about 5 nm or less of a dielectric material such as $SiO_2$, a nitride such as $Si_3N_4$, an oxynitride such as SiON, a high-k dielectric material having a dielectric constant or k value of greater than about 3.9, such as a hafnium-based dielectric or other high k materials, or combinations and/or multiple layers thereof, as examples. In some embodiments, the gate dielectric material 112 comprises HfSiON, $HfSiO_x$, or $HfO_2$. In some embodiments, the gate dielectric material 112 comprises HfSiON, $HfSiO_x$, or $HfO_2$ in a crystalline form. For example, the gate dielectric material 112 may comprise polycrystalline HfSiON, $HfSiO_x$, or $HfO_2$ that functions as a seed layer for a subsequent epitaxial growth process of a semiconductive material to form the resistor 136, to be described further herein. Alternatively, the gate dielectric material 112 may comprise other dimensions and materials, for example. The gate dielectric material 112 may be formed using an oxidation or nitridation process, chemical vapor deposition (CVD), atomic layer deposition (ALD), metal organic chemical vapor deposition (MOCVD), physical vapor deposition (PVD), a spin-on process, jet vapor deposition (JVD), or combinations thereof, as examples, although alternatively, other methods may also be used to form the gate dielectric material 112.

An optional cap layer, which is not shown in the figures, may be formed over the gate dielectric material 112. The cap layer may comprise a thickness of about 5 nm or less and may comprise LaO, DyO, MgO, or AlO, as examples. Alternatively, the cap layer may comprise other materials and dimensions. The optional cap layer may be used to pin the work function of the transistors 134 and 138 in the first region 104 and the third region 108, respectively. The material and thickness of the optional cap layer may be selected to achieve the desired work function for the transistors 134 and 138.

The transistor material stack 112/114/116 includes a metal layer 114 that is formed over the gate dielectric material 112, as shown in FIG. 3, or over the optional cap layer, if the cap layer is included. The metal layer 114 may comprise about 30 nm or less of TiN, TaN, TiC, TiCN, MoN, other metals, or combinations and/or multiple layers thereof, as examples, although alternatively, the metal layer 114 may comprise other materials. The metal layer 114 may be formed by CVD, PVD, or other methods, as examples.

The transistor material stack 112/114/116 includes a semiconductive material 116 that is formed or deposited over the metal layer 114. The semiconductive material 116 may comprise about 200 nm or less of a semiconductive material such as polysilicon, amorphous silicon, or a combination or multiple layers thereof, for example, although alternatively, the semiconductive material 116 may comprise other dimensions and semiconductor materials. In some embodiments, the semiconductive material 116 comprises a thickness of about 50 nm, as an example. The semiconductive material 116 may be formed by CVD, PVD, or other methods, as examples. In some embodiments, the semiconductive material 116 comprises the same material as the workpiece 102. The semiconductive material 116 is also referred to herein as a first semiconductive material 116.

The semiconductive material 116, metal layer 114, optional cap layer, and gate dielectric material 112 comprise a gate stack for the transistors 134 and 138 in the first region 104 and the third region 108, respectively, for example.

Figure 4:
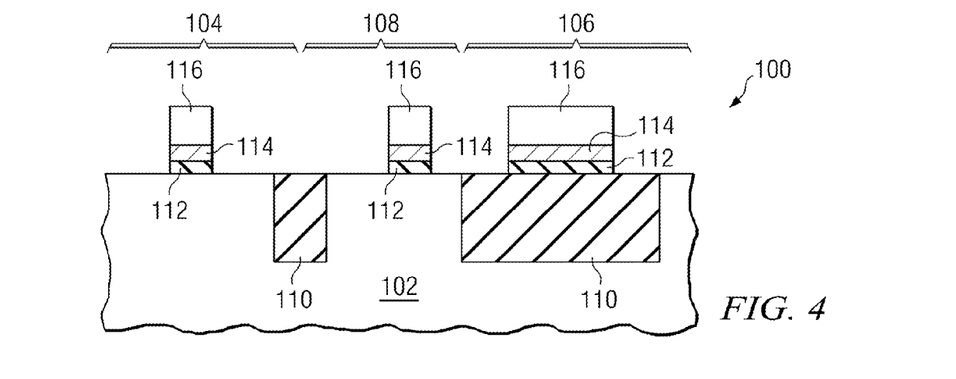

The transistor material stack 112/114/116 is patterned thereby forming a gate 114/116 of the first transistor 134 in the first region 104 of the workpiece 102 and leaving a portion of the transistor material stack 112/114/116 in the second region 106 of the workpiece 102, as shown in FIG. 4. A gate 114/116 of a second transistor 138 may also be formed in the third region 108 of the workpiece 102 during the patterning of the transistor material stack 112/114/116, as shown.

The transistor material stack 112/114/116 may be patterned by depositing a layer of photosensitive material (not shown) over the semiconductive material 116 of the transistor material stack 112/114/116, and patterning the layer of photosensitive material using a lithography process. Portions of the layer of photosensitive material are exposed to energy, e.g., using a lithography mask or a direct patterning method, exposing portions of the layer of photosensitive material. The layer of photosensitive material is developed, and portions of the layer of photosensitive material are then removed. The layer of photosensitive material is used as an etch mask while portions of the transistor material stack 112/114/116 are etched away using an etch process. The etch process may comprise a reactive ion etch (RIE), as an example, although alternatively, other types of etch processes may be used. The layer of photosensitive material is then removed. An optional hard mask (also not shown) may also be used in the lithography process to pattern the transistor material stack 112/114/116, for example.

The portion of the transistor material stack 112/114/116 left remaining in the second region 106 of the workpiece 102 defines the footprint or shape of a resistor (see resistor 136 in FIG. 11) that will be formed in the second region 106. For example, the patterned semiconductive material 116, metal layer 114, optional cap layer, and gate dielectric material 112 define the shape of a resistor in a top view in the second region 106.

Figure 5:
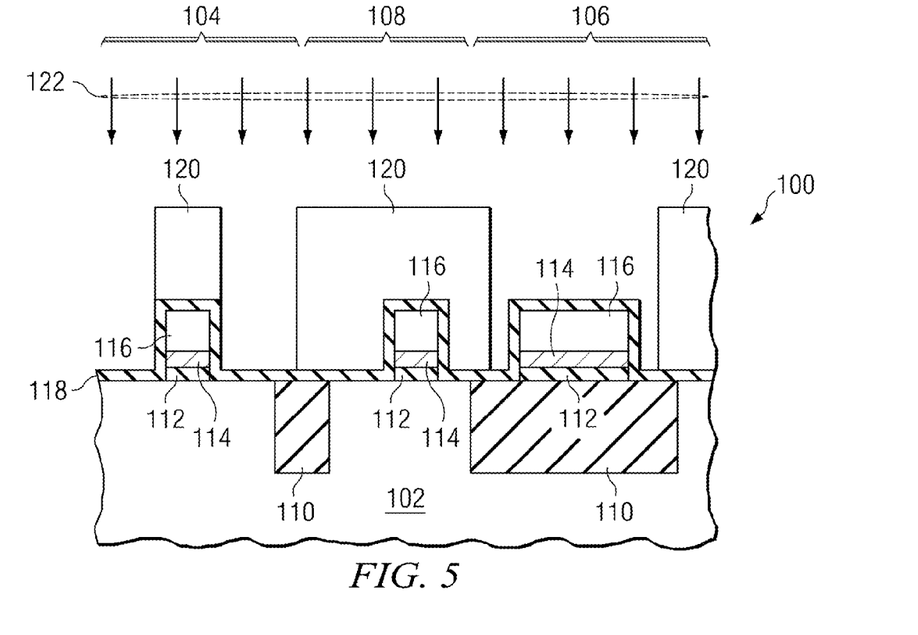
Figure 6:
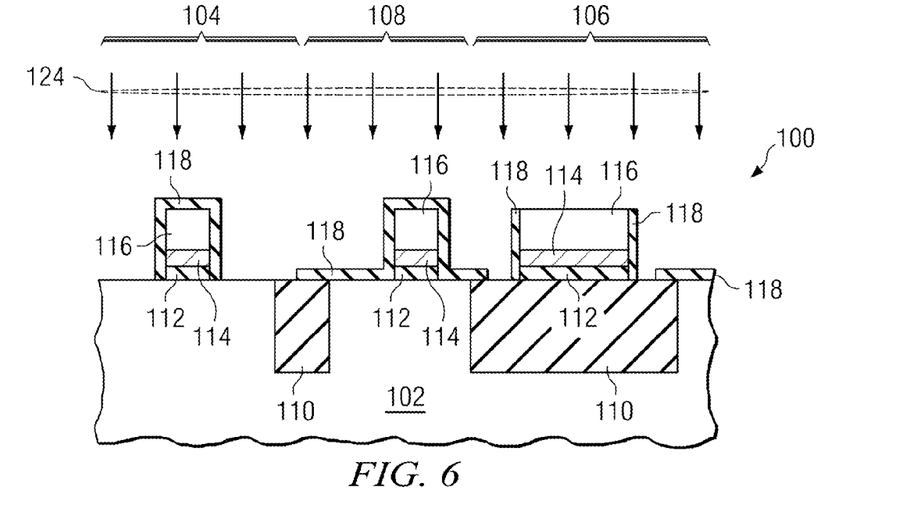
Figure 7:
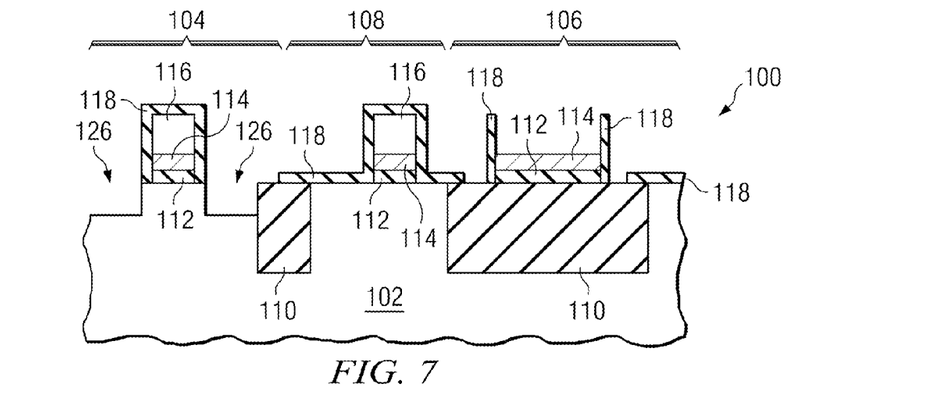

Next, a top portion, e.g., the semiconductive material 116, of the transistor material stack 112/114/116 is removed in the second region 106 of the workpiece 102 and a top portion of the workpiece 102 is removed in the first region 104 of the workpiece 102 proximate the gate of the transistor, forming recessed regions 126 in the workpiece 102 in the first region 104, as shown in FIGS. 5 through 7. In some embodiments, the semiconductive material 116 in the second region 106 is removed simultaneously while forming the recessed regions 126 in the top portion of the workpiece 102 in the first region 104, using a single etch process.

To remove the semiconductive material 116 in the second region 106 and form the recessed regions 126 in the workpiece 102 in the first region 104, at least the gate of the first transistor 134 in the first region 104 may be masked, leaving at least a top surface of the transistor material stack 112/114/116 in the second region 106 exposed. The third region 108 may also be masked. For example, a hard mask 118 may be deposited over exposed portions of the workpiece 102 and over the patterned transistor material stack 112/114/116, as shown in FIG. 5. The hard mask 118 may comprise about 100 nm or less of an insulating material such as silicon nitride, silicon oxide, or multiple layers or combinations thereof, as examples, although alternatively, the hard mask 118 may comprise other dimensions and materials. In some embodiments, the hard mask 118 comprises silicon nitride, as an example.

A layer of photoresist 120 may be deposited over the hard mask 118, and the layer of photoresist 120 may be patterned using lithography, as shown in FIG. 5, leaving photoresist 120 over the hard mask 118 over the top surface and sidewalls of the transistor material stack 112/114/116 in the first region 104 and optionally also over the optional third region 108, and exposing the hard mask 118 over the top surface and sidewalls of the transistor material stack 112/114/116 in the second region 106 of the workpiece 102. A portion of the hard mask 118 over the isolation region 110 in the second region 106 may also be left exposed proximate the patterned portion of the transistor material stack 112/114/116 in the second region 106, as shown.

The hard mask 118 is patterned using an etch process 122, as shown in FIG. 5, and the layer of photoresist 120 is removed, leaving the structure shown in FIG. 6. The etch process 122 used to pattern the hard mask 118 may be directional or anisotropic, so that top surfaces of the exposed hard mask 118 are etched away preferentially to portions of the hard mask 118 residing on sidewall surfaces. The etch process 122 may comprise a RIE process in some embodiments, although alternatively, other types of etch processes 122 may be used.

After the hard mask 118 is patterned and the layer of photoresist 120 is removed, the hard mask 118 is left remaining over the top surface and sidewalls of the patterned transistor material stack 112/114/116 in the first region 104 and over the third region 108. A small portion of the hard mask 118 may optionally also be left remaining on sidewalls of the patterned transistor material stack 112/114/116 in the second region 106, as shown in FIG. 6.

An etch process 124 is then used to remove a top portion of the workpiece 102 proximate the gate 114/116 of the transistor 134 in the first region 104, to form recessed regions 126 in the workpiece 102 proximate the gate 114/116, as shown in FIG. 7. Because the semiconductive material 116 is exposed in the second region 106 and because the semiconductive material 116 may comprise silicon or the same material as the workpiece 102, the semiconductive material 116 is also removed in the second region 106, as shown. The etch process 124 may comprise an etch process that is selective to the material of the isolation region 110 so that the isolation region 110 is not removed during the etch process 124. The etch process 124 may comprise a RIE, for example, although alternatively, other types of etch processes may be used.

Figure 8:
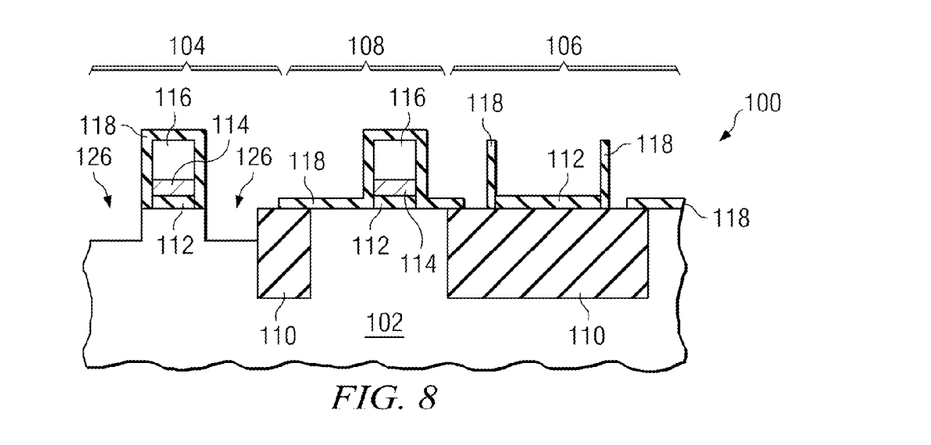

The metal layer 114 is then removed from the second region 106 of the workpiece 102, as shown in FIG. 8. For example, the workpiece 102 may be cleaned using an epitaxy pre-cleaning process, which pre-treats the workpiece 102 surface in the first region 104 and also advantageously results in the metal layer 114 being removed from the second region 106. The pre-cleaning process may comprise a cleaning process using $H_2O:H_2O_2:NH_4OH$ at a temperature of about 25 degrees C. for about 5 minutes, as an example, although alternatively, other cleaning chemistries and processes may be used. Alternatively, a separate etch process may be used to remove the metal layer 114 from the second region 106, for example, in some embodiments.

Figure 9:
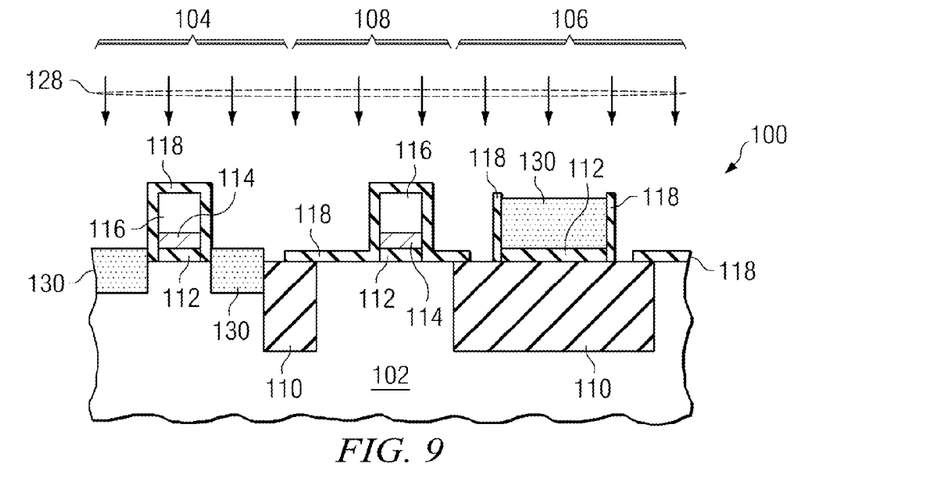

Next, a semiconductive material 130 is formed in the recessed regions 126 of the workpiece 102 in the first region 104 and over a portion of the transistor material stack 112/114/116, e.g., over the gate dielectric material 112, in the second region 106, as shown in FIG. 9. The semiconductive material 130 is also referred to herein as a second semiconductive material 130 or a compound semiconductive material 130, for example. The second semiconductive material 130 forms source and drain regions of the first transistor 134 (see FIG. 11) in the first region 104 and forms a resistor 136 comprising the semiconductive material 130 in the second region 106. The resistor 136 is formed over the isolation region 110 in the second region 106 and comprises the same shape as the patterned gate dielectric material 112 in the second region 106. The gate dielectric material 112 defines the shape of the resistor 136 and may provide additional isolation for the resistor 136 from the underlying workpiece 102, for example.

The second semiconductive material 130 may be formed using a growth process 128, as shown in FIG. 9. In some embodiments, the growth process 128 may comprise an epitaxial growth process, for example. The semiconductive material 130 may comprise a compound semiconductive material comprising two or more semiconductor materials. In one embodiment, the semiconductive material 130 comprises SiGe, as an example, although alternatively, the semiconductive material 130 may comprise other materials. In other embodiments, the semiconductive material 130 may comprise Ge or InP, for example, although other semiconductive materials may also be used. The thickness of the semiconductive material 130 may comprise about 100 nm or less, and may comprise about 60 nm in some embodiments, for example, although alternatively, the thickness of the semiconductive material 130 may comprise other dimensions.

In embodiments wherein the gate dielectric material 112 comprises a crystalline material, the gate dielectric material 112 may function as a seed for the epitaxially grown semiconductive material 130, resulting in a resistor 136 comprising crystalline semiconductive material 130, for example. The semiconductive material 130 may comprise polycrystalline SiGe, Ge, or InP in some embodiments, as an example. The formation of a crystalline semiconductive material 130 increases the resistance of the resistor 136, for example.

Figure 10:
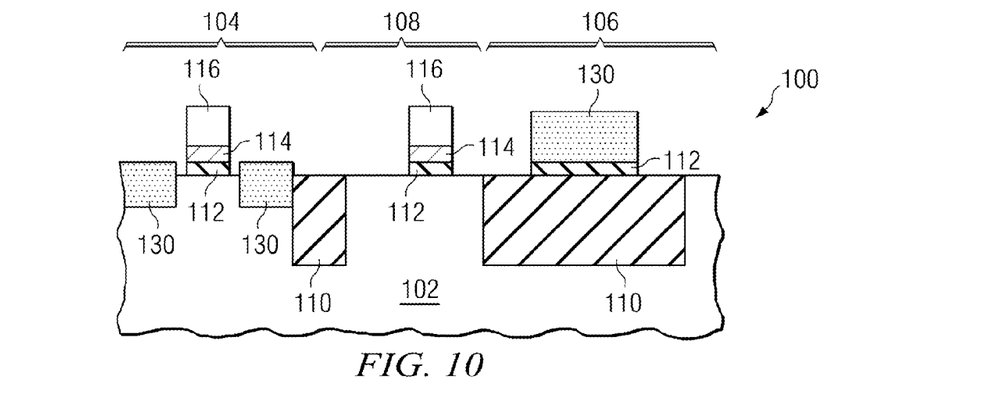

The hard mask 118 is then removed, as shown in FIG. 10. The hard mask 118 may be removed with hot phosphoric acid, as an example, although other removal methods and chemistries may also be used. Sidewall spacers 132 comprising an insulating material are then formed over sidewalls of the transistors 134 and 138 in the first and third regions 104 and 108, as shown in FIG. 11. Sidewall spacers 132 may also be formed on sidewalls of the resistors 136 in the second region 106, for example, also shown in FIG. 11. The sidewall spacers 132 of the resistor 136 may be formed at the same time and using the same materials as sidewall spacers 132 of the transistors 134 and 138 formed in the first and third region 104 and 108. The sidewall spacers 132 may be formed by depositing an insulating material or materials over the workpiece 102, and etching the insulating material using an anisotropic etch process, leaving the insulating material on sidewalls of the gate stacks 112/114/116 of the transistors 134 and 138 and on sidewalls of the semiconductive material 130 and gate dielectric material 112 of the resistor 136.

Source and drain regions 139 are formed in the workpiece 102 proximate the gate 114/116 of the second transistor 138 in the third region 108, also shown in FIG. 11. In some embodiments, the resistor 136 may be implanted with a dopant material, e.g., comprising a P+ type of material, such as boron. For example, the third region 108 of the workpiece 102 may be masked, and the resistor 136 and the source and drain regions comprising the semiconductive material 130 of the first transistor 134 in the first region 104 may be implanted with a P+ type of material. Alternatively, the dopant material for the resistor 136 may comprise other materials. The resistor 136 may be implanted using a separate processing step, wherein the first region 104 and the third region 108 are masked e.g., with a photoresist, during the implantation process. Alternatively, in other embodiments, the resistor 136 may be implanted with a P+ type of material during an implantation process for the first transistor 134 or the second transistor 138, by altering a lithography mask and open the second region 106 for an existing implantation process for the semiconductor device 100, for example.

Source and drain regions of the first transistor 134 and the second transistor 138 in regions 104 and 108, respectively, may require different types of doping. One of the doping processes for the source and drain regions comprising the semiconductive material 130 or source and drain regions 139 may be used to implant the resistor 136 in the second region 106 with a dopant material to achieve a desired resistance for the resistor 136. Implanting the resistor 136 with boron decreases the resistance of the resistor 136, as an example. The implantation processes may comprise shallow implantation processes for forming extension implantation regions, or deeper implantation processes used to form halo implantation regions, or both, as examples.

Processing of the semiconductor device 100 is then continued to complete the fabrication process. For example, additional insulating material layers and conductive material layers, e.g., metallization layers (not shown), may be formed over the transistors 134 and 138 and novel resistors 136, and may be used to interconnect the various components of the semiconductor device 100.

The type of material of the gate dielectric 112, the optional cap layer, the metal layer 114, and the first semiconductive material 116 may be selected to achieve desired properties for the transistors 134 and 138 in the first and second regions 104 and 106, respectively. The type of material of the second semiconductive material 130 and the size of the resistor 136 may be selected or adjusted to achieve a desired amount of resistance for the resistor 136 in the second region 106, for example.

The resistor 136 in the second region 106 may comprise a length of about 1 μm or greater and a width of about 1 μm or greater in a top view, as examples. The length and width of the resistor 136 in the second region 106 are functions of the application and the desired amount of resistance for the resistor 136 in the second region 106, for example. In some applications, the resistor 136 in the second region 106 may comprise a length of about 5 μm and a width of about 1 to 2 μm, as one example. The resistor 136 may be square or rectangular in a top view. Alternatively, the resistor 136 in the second region 106 of the workpiece 102 may comprise other dimensions and shapes.

Figure 12:
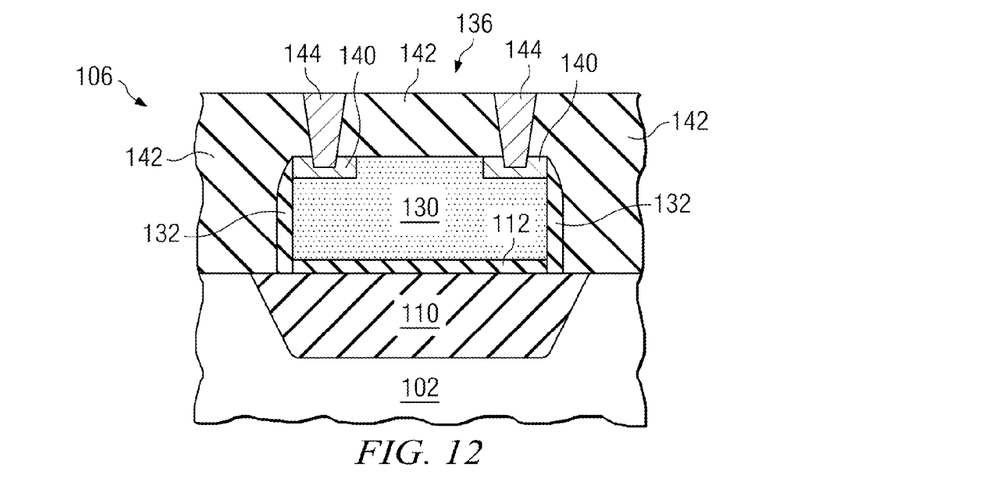
FIG. 12 shows a cross-sectional view of a resistor in accordance with an embodiment of the present invention after contacts have been coupled to each end of the resistor.

The ends of the resistor 136 in the second region 106 may optionally be silicided, and contacts 144 may be coupled to the silicided ends of the resistor 136. For example, FIG. 12 shows a cross-sectional view of a resistor 136 in a second region 106 of a workpiece 102 in accordance with an embodiment of the present invention after contacts 144 have been coupled to each end of the resistor 136. The resistor 136 comprises the semiconductive material 130 comprising the same semiconductive material 130 that was used to fill recesses 126 of the source and drain regions of a first transistor 134 in the first region 104 (see FIGS. 8 and 11), as described herein. The silicide 140 may be formed over a first end of the resistor 136 and over a second end of the resistor 136 opposite the first end, as shown. The silicide 140 may lower the contact resistance in some applications, for example. The silicide 140 may be used to define a linear ohmic contact resistance of the resistor 136 in the second region 106 and may avoid Schottky diode behavior of portions of the resistor 136, for example.

The contacts 144 may be formed using a single damascene process, e.g., by forming an insulating material 142 over the workpiece 102 and the resistor 136. The insulating material 142 is patterned using lithography, and the patterned insulating material 142 is filled with a conductive material to form the contacts 144. Excess conductive material is then removed from over the insulating material 142 using an etch process and/or a chemical mechanical polishing (CMP) process, for example. Alternatively, the contacts 144 may be formed using a subtractive etch process of a conductive material formed over the resistor 136, and the insulating material 142 may be formed over the contacts 144 and resistor 136.

The contacts 144 may comprise a plurality of contacts coupled to silicided ends of the resistor 136. Alternatively, the contacts 144 may comprise elongated contact bars. If elongated contact bars 144 are used, the silicide 140 may be omitted in some applications, because elongated contact bars 144 have a lower contact resistance and may not require the silicide 140 to reduce the contact resistance in some applications, for example. A lower end resistance ($R_{end}$) of the resistor may be achieved by eliminating the silicide 140 and using elongated contact bars 144, for example, by eliminating tungsten-silicide and silicide-polysilicon transition resistances. However, in other applications, the silicide 140 may be included if elongated contact bars 144 are used. The silicide 140 may function as an etch stop during an etch process of the contact 144, for example, providing a higher etch selectivity than the semiconductive material 130 of the resistor 136. The elongated contact bars 144 improve the contact resistance because of the larger contact area provided.

Silicide regions are often formed in other regions of semiconductor devices 100, such as over gates, sources and drains of transistors. Thus, advantageously, no additional lithography masks may be required to form the optional silicide 140 regions of the semiconductor devices 100 described herein. The silicide 140 may be formed over the ends of the resistors 136 in the second region 106 during the formation of other silicided regions of the semiconductor devices 100, for example. The silicide 140 may comprise NiSi or other types of silicide, for example.

Embodiments of the present invention include methods of fabricating the semiconductor devices 100 and resistors 136 described herein during the fabrication processes for transistors 134 and 138 of the semiconductor devices 100. Embodiments of the present invention also include semiconductor devices 100 and resistors 136 manufactured using the methods described herein.

For example, in one embodiment, shown in FIG. 11, a semiconductor device 100 includes a transistor 134 disposed in a first region 104 of a workpiece 102. The transistor 134 includes source and drain regions comprising a first semiconductive material 130. The transistor includes a gate dielectric material 112 and a gate 114/116 comprising a metal layer 114 disposed over the gate dielectric material 112 and a second semiconductive material 116 disposed over the metal layer 114. The semiconductor device 100 includes a resistor 136 disposed in a second region 106 of the workpiece 102, the resistor 136 comprising the first semiconductive material 130 disposed over the gate dielectric material 112. The semiconductor device 100 may include an optional third transistor 138 formed in a third region 108 of the workpiece 102.

Embodiments of the present invention are particularly useful when implemented in resistors for radio frequency (RF) circuits and applications. Embodiments of the invention may also be implemented in other semiconductor applications such as analog circuits, mixed signal circuits, and other applications requiring relatively large resistors requiring a medium to high amount of resistance, for example. Embodiments of the present invention may also be implemented in other types of circuits and semiconductor devices.

Embodiments of the present invention achieve technical advantages by forming novel resistors 136 during the manufacturing process flow for transistors 134 and 138 of semiconductor devices 100. Existing process steps for manufacturing transistors 134 and 138 may be used to manufacture the resistors 136 by modifying the lithography masks, resulting in extremely cost-effective methods of fabricating the resistors 136. Examples of existing process steps for transistors 134 and 138 that may be utilized to manufacture the novel resistors 136 include the deposition and patterning of the transistor material stack 112/114/116 shown in FIGS. 3 and 4, the use of a lithography mask level and hard mask 118 for protecting the third region 108 during the recessing of the source and drain regions of the first transistor 134 in the first region 104 as shown in FIGS. 5, 6, and 7, the use of an epitaxial growth process 128 to form source and drain regions comprising the semiconductive material 130 of the first transistor 134 in the first region 104 as shown in FIG. 9, and optionally also implantation processes for the transistors 134 or 138 and/or silicide processes for other regions of the semiconductor device 100.

Advantageously, as described herein, in some embodiments, no additional lithography masks or processes are required to achieve medium to high resistance resistors 136 that do not include a metal layer 114 of a transistor material stack 112/114/116. The novel resistors 136 advantageously may be formed during the fabrication and lithography processes used to form other devices such as transistors 134 and 138 of the semiconductor devices 100, and thus do not require any additional processing steps, lithography masks, or manufacturing costs. The definition of existing lithography masks may be altered to include opening portions of the second regions 106 of the workpiece 102, as described herein. The masking processes, etching processes 122 and 124, and epitaxial growth processes 128 described herein may be included in existing mask levels and processes already implemented for the semiconductor device 100.

Because the resistors 136 do not include the metal layer 114, the sheet resistance is high, e.g., and may comprise several hundred Ohms/square, e.g., up to 700 Ohms/square or greater. Resistances of the resistors 136 are achievable that are comparable to polysilicon resistors, for example. The transistors 134 and 138 formed on the same chip or semiconductor device 100 include the metal layer 114 and have a low sheet resistance. Embodiments of the present invention are particularly useful in high speed transistor applications that include embedded epitaxially grown SiGe, Ge, or InP in PMOS transistor source and drain regions.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device, comprising:
   a semiconductor body of a first semiconductive material;
   a transistor disposed in the semiconductor body, the transistor including a semiconductive gate region comprising the first semiconductive material and source and drain regions of a second semiconductive material, wherein the first semiconductive material and the second semiconductive material are different types of material, wherein the source and drain regions are embedded in the semiconductor body;
   a semiconductive resistor overlying a top surface of the semiconductor body and laterally spaced from the transistor, the resistor comprising the second semiconductive material, the resistor and the gate region being a different type of semiconductor material, and the resistor and the source and drain regions being a same type of semiconductor material;
   a gate dielectric layer overlying the top surface of the semiconductor body, wherein the resistor overlies the gate dielectric layer;
   a first silicide region embedded at a first end of the semiconductive resistor;
   a second silicide region embedded at a second end of the semiconductive resistor; and
   an insulator layer contacting and covering a top surface of the semiconductive resistor, wherein a structure comprising the resistor is embedded in the insulator layer.

2. The device according to claim 1, wherein the second semiconductive material of the resistor comprises a crystalline material.

3. The device according to claim 1, wherein the second semiconductive material comprises SiGe.

4. The device according to claim 1, wherein the second semiconductive material comprises Ge.

5. The device according to claim 1, wherein the second semiconductive material comprises InP.

6. The device according to claim 1, wherein the first semiconductive material comprises elemental silicon and the second semiconductive material comprises a compound semiconductor material.

7. The device according to claim 6, wherein the second semiconductive material comprises SiGe.

8. The device according to claim 6, wherein the second semiconductive material comprises InP.

9. The device according to claim 1, wherein the first semiconductive material comprises elemental silicon and the second semiconductive material comprises an elemental semiconductive material other than silicon.

10. The device according to claim 9, wherein the second semiconductive material comprises Ge.

11. The device according to claim 1, wherein the transistor and resistor are implemented in a radio frequency (RF) circuit, an analog circuit, or a mixed signal circuit.

12. A semiconductor device, comprising:
    a transistor disposed in a first region of a semiconductor body that comprises a first semiconductive material, the transistor including source and drain regions comprising a second semiconductive material that is a different type of material than the first semiconductive material, the transistor further including a gate dielectric material disposed over the semiconductor body and a gate comprising a metal layer disposed over the gate dielectric material and a semiconductor layer comprising the first semiconductive material disposed over the metal layer; and
    a semiconductive resistor disposed above a second region of the semiconductor body, the second region being laterally spaced from the first region, the resistor comprising the second semiconductive material disposed over the gate dielectric material, the resistor and the first semiconductive material of the gate being a different type of semiconductor material, and the resistor and the source and drain regions being a same type of semiconductor material;
    a first silicide region embedded at a first end of the semiconductive resistor;
    a second silicide region embedded at a second end of the semiconductive resistor;
    an insulator layer contacting and covering a top surface of the semiconductive resistor; and
    a first elongated contact and a second elongated contact disposed in the insulator layer, the first and the second elongated contacts coupled to the resistor through the first and the second silicide regions.

13. The device according to claim 12, wherein the source and drain regions are embedded in the semiconductor body and wherein the resistor overlies a top surface of the semiconductor body.

14. The device according to claim 12, wherein the second semiconductive material of the resistor comprises a crystalline material.

15. The device according to claim 12, wherein the first semiconductive material comprises elemental silicon and the second semiconductive material comprises a compound semiconductor material.

16. The device according to claim 15, wherein the second semiconductive material comprises InP.

17. The device according to claim 15, wherein the second semiconductive material comprises SiGe.

18. The device according to claim 12, wherein the first semiconductive material comprises elemental silicon and the second semiconductive material comprises an elemental semiconductive material other than silicon.

19. The device according to claim 18, wherein the second semiconductive material comprises Ge.

20. A method of fabricating a semiconductor device, the method comprising:
    forming a transistor in a first region of a semiconductor body comprising a first semiconductive material, the transistor including source and drain regions comprising a second semiconductive material that is a different type of material than the first semiconductive material, the transistor including a gate dielectric material disposed over the semiconductor body and a gate comprising a metal layer disposed over the gate dielectric material and a semiconductor layer comprising the first semiconductive material disposed over the metal layer; and
    forming a semiconductive resistor over a second region of the semiconductor body, the second region being laterally spaced from the first region, the resistor comprising the second semiconductive material disposed over the gate dielectric material, the resistor and the semiconductor layer being a different type of semiconductor material, and the resistor and the source and drain regions being a same type of semiconductor material;

embedding a first silicide region at a first end of the semiconductive resistor;

embedding a second silicide region embedded at a second end of the semiconductive resistor;

forming an insulator layer contacting and covering a top surface of the semiconductive resistor; and forming a first elongated contact and a second elongated contact in the insulator layer, the first and the second elongated contacts coupled to the resistor through the first and the second silicide regions.

21. The method according to claim 20, wherein the second semiconductive material of the resistor comprises a crystalline material.

22. The method according to claim 20, wherein the second semiconductive material comprises SiGe, Ge, or InP.

23. The method according to claim 20, wherein the first semiconductive material comprises elemental silicon and the second semiconductive material comprises a compound semiconductor material or an elemental semiconductive material other than silicon.

24. The method according to claim 20, wherein the resistor is implemented in a radio frequency (RF) circuit, an analog circuit, or a mixed signal circuit.

* * * * *